(12) United States Patent
Ohsaki

(10) Patent No.: US 8,294,875 B2
(45) Date of Patent: Oct. 23, 2012

(54) EXPOSURE APPARATUS AND DEVICE FABRICATION METHOD

(75) Inventor: Yoshinori Ohsaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 371 days.

(21) Appl. No.: 12/169,734

(22) Filed: Jul. 9, 2008

(65) Prior Publication Data

US 2009/0015815 A1    Jan. 15, 2009

(30) Foreign Application Priority Data

Jul. 12, 2007 (JP) ................................. 2007-183645

(51) Int. Cl.
 G03B 27/68 (2006.01)
 G03B 27/52 (2006.01)
 G03B 27/74 (2006.01)
 G01B 11/02 (2006.01)
(52) U.S. Cl. ............... 355/52; 355/55; 355/68; 356/515
(58) Field of Classification Search .................... 355/53, 355/68, 77, 55, 52; 359/515, 521
 See application file for complete search history.

(56) References Cited

U.S. PATENT DOCUMENTS

| 6,456,377 B1* | 9/2002 | Suzuki et al. ................. 356/399 |
| 7,746,479 B2 | 6/2010 | Yamamoto | |
| 2006/0119821 A1* | 6/2006 | Ando et al. ...................... 355/55 |
| 2006/0221316 A1* | 10/2006 | Yamamoto ....................... 355/53 |
| 2006/0262323 A1 | 11/2006 | Yamamoto | |

FOREIGN PATENT DOCUMENTS

| JP | 2005-244126 A | 9/2005 |
| JP | 2006-073697 A | 3/2006 |
| JP | 2006-108597 A | 4/2006 |
| JP | 2006324311 | 11/2006 |
| JP | 2007165845 A | 6/2007 |
| KR | 10-2006-0119775 A | 11/2006 |

OTHER PUBLICATIONS

Office Action issued in corresponding Korean Patent Application No. 10-2008-0067305 dated Mar. 25, 2010.
Office Action issued in counterpart Japanese patent application No. JP2007-183645, issued on Feb. 24, 2012.

* cited by examiner

*Primary Examiner* — Edward J Glick
*Assistant Examiner* — Deoram Persaud
(74) *Attorney, Agent, or Firm* — Rossi, Kimms & McDowell LLP

(57) ABSTRACT

The present invention provides an exposure apparatus comprising a projection optical system configured to project a pattern of a reticle onto a substrate, a stage configured to move the substrate; and a sensor unit which is arranged on the stage and configured to receive light having passed through the projection optical system, the sensor unit including an aperture plate which is configured to be used in measuring different optical performances, and on which a plurality of aperture patterns with different shapes or different sizes are formed, and a photoelectric conversion device configured to photoelectrically convert the light beams from the plurality of aperture patterns.

11 Claims, 10 Drawing Sheets

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

A projection exposure apparatus which projects and transfers a circuit pattern drawn on a reticle (mask) onto, for example, a wafer via a projection optical system has conventionally been employed to fabricate a semiconductor device using photolithography (printing). Since this exposure apparatus is required to precisely transfer the pattern on a reticle onto a wafer with a predetermined magnification (reduction ratio), it is important to use a projection optical system with a good imaging performance and small aberration.

In recent years, along with further progress in the micropatterning of semiconductor devices, a pattern with a minimum line width that exceeds the general imaging performance of an optical system has come to be often transferred, and therefore the transferred pattern is becoming sensitive to the aberration of the optical system. This makes it necessary to suppress the allowable amount of residual aberration of the projection optical system to 10 m$\lambda$ or less in rms value and, recently, to several m$\lambda$ in rms value.

Under the circumstances, even when the aberration of the projection optical system is guaranteed, an amount of aberration as small as about several m$\lambda$ may change with time. To cope with this problem, it is demanded to measure the optical performances (particularly the wavefront aberration) of the projection optical system while it is mounted (built) in the exposure apparatus, that is, while it is ready for use in actual exposure.

To meet this demand, there have been proposed exposure apparatuses which mount interferometers such as a point diffraction interferometer (PDI), line diffraction interferometer (LDI), and lateral shearing interferometer each of which is used to measure the wavefront aberration of a projection optical system. These exposure apparatuses are disclosed in Japanese Patent Laid-Open Nos. 2005-244126, 2006-073697, and 2006-108597.

The imaging performance of the exposure apparatus is known to also depend on an effective light source distribution formed by an illumination optical system. For example, if a plurality of exposure apparatuses use different effective light source distributions, they form patterns with different line widths even when the same reticle is exposed. To cope with this problem, it is also demanded to measure an effective light source distribution formed by the illumination optical system on the exposure apparatus. The effective light source distribution can be measured by receiving a light beam, which emerges from a pinhole PH that has a diameter of several micrometers to several tens of micrometers and is inserted between an illumination optical system and a projection optical system PS, via the projection optical system PS by a sensor LS arranged on a wafer stage as shown in FIG. 10. FIG. 10 is a view for explaining the conventional mechanism of effective light source distribution measurement.

It is also demanded to measure the light distribution on the pupil plane of the projection optical system upon illuminating a reticle under an illumination condition under which a reticle for use in actual exposure is exposed, that is, the distribution (diffracted light distribution) of light diffracted by the reticle pattern. Measuring the diffracted light distribution on the entire reticle surface makes it possible to predict a change in the aberration of the projection optical system due to exposure heat with high accuracy.

Unfortunately, when measurement patterns (of a substrate) and sensors dedicated to respectively measuring the wavefront aberration, effective light source distribution, and diffracted light distribution are mounted (arranged) on a wafer stage, the weight on the wafer stage increases, resulting in a decrease in stage performance and an increase in stage size. In addition, when a large number of sensors are arranged on the wafer stage, heat generated by these sensors is accumulated and acts on the wafer stage, resulting in a further decrease in stage performance.

SUMMARY OF THE INVENTION

The present invention provides an exposure apparatus which can measure a plurality of optical performances such as the wavefront aberration, effective light source distribution, and diffracted light distribution without decreasing the stage performance and increasing the stage size.

According to one aspect of the present invention, there is provided an exposure apparatus comprising a projection optical system configured to project a pattern of a reticle onto a substrate, a stage configured to move the substrate, and a sensor unit which is arranged on the stage and configured to receive light having passed through the projection optical system, the sensor unit including an aperture plate which is configured to be used in measuring different optical performances, and on which a plurality of aperture patterns with different shapes or different sizes are formed, and a photoelectric conversion device configured to photoelectrically convert the light beams from the plurality of aperture patterns.

According to another aspect of the present invention, there is provided an exposure apparatus comprising an illumination optical system configured to illuminate a reticle with a light beam from a light source, a projection optical system configured to project a pattern of the reticle onto a substrate supported by a stage, and a sensor unit, the sensor unit including an aperture plate which is arranged on the stage, and on which an aperture pattern configured to pass the light beam from the projection optical system is formed, and a photoelectric conversion device which is arranged on the stage and configured to photoelectrically convert the light beam from the aperture pattern, wherein an output from the photoelectric conversion device is switched in accordance with cases in which a wavefront aberration of the projection optical system, an effective light source distribution formed by the illumination optical system, a diffracted light distribution generated by the pattern of the reticle, and a pupil transmittance distribution of the projection optical system are measured.

According to still another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

DESCRIPTION OF THE EMBODIMENTS

Figure 1:
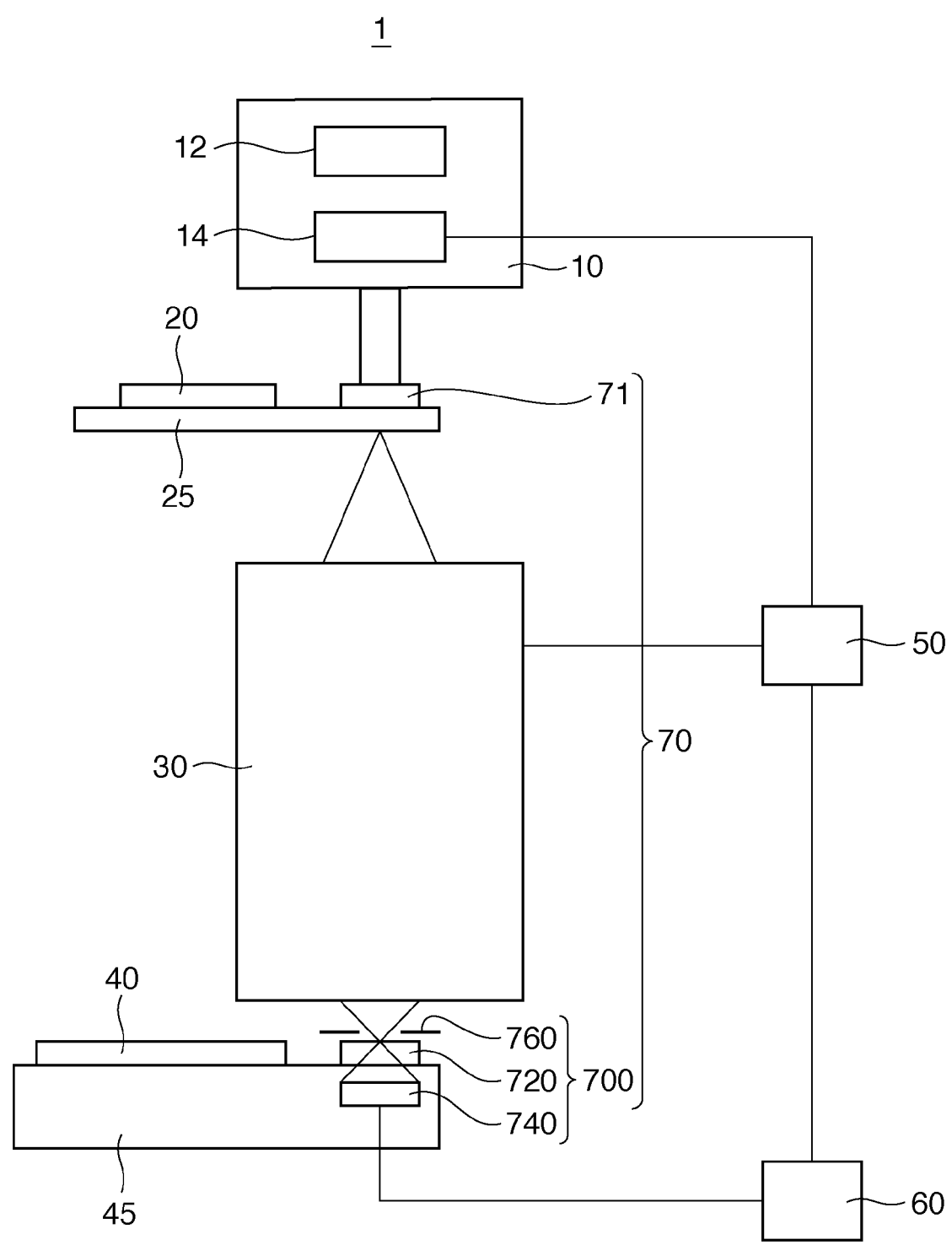
FIG. 1 is a schematic block diagram showing an exposure apparatus according to one aspect of the present invention.

A preferred embodiment of the present invention will be described below with reference to the accompanying drawings. The same reference numerals denote the same members throughout the drawings, and a repetitive description thereof will not be given.

FIG. 1 is a schematic block diagram showing the arrangement of an exposure apparatus 1 according to one aspect of the present invention. In this embodiment, the exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

The exposure apparatus 1 includes an illumination apparatus 10, a reticle stage 25 for supporting the reticle 20, a projection optical system 30, a wafer stage 45 for supporting the wafer 40, an adjusting unit 50, a control unit 60, and a measurement unit 70.

The illumination apparatus 10 includes a light source 12 and illumination optical system 14 and illuminates the reticle 20 on which a circuit pattern to be transferred is formed.

The light source 12 is, for example, an excimer laser such as a KrF excimer laser with a wavelength of about 248 nm or an ArF excimer laser with a wavelength of about 193 nm. However, the light source 12 is not particularly limited to an excimer laser, and may be, for example, an $F_2$ laser with a wavelength of about 157 nm.

The illumination optical system 14 illuminates the reticle 20 with a light beam from the light source 12.

The reticle 20 has a circuit pattern and is supported and driven by the reticle stage 25. Diffracted light generated by the reticle 20 is projected onto the wafer 40 via the projection optical system 30. Since the exposure apparatus 1 is of the step & scan scheme, it projects the pattern of the reticle 20 onto the wafer 40 by scanning the reticle 20 and wafer 40.

The reticle stage 25 supports the reticle 20 and a reticle-side measurement substrate 71 and drives them using, for example, a linear motor. The reticle stage 25 exchangeably inserts the reticle 20 and reticle-side measurement substrate 71 onto the object plane of the projection optical system 30. More specifically, the reticle stage 25 inserts the reticle 20 onto the object plane of the projection optical system 30 in transferring the pattern of the reticle 20 by exposure, while it inserts the reticle-side measurement substrate 71 onto the object plane of the projection optical system 30 in measuring the wavefront aberration of the projection optical system 30.

The projection optical system 30 projects the pattern of the reticle 20 onto the wafer 40. The projection optical system 30 can be a dioptric system, catadioptric system, or catoptric system.

The wafer 40 is a substrate onto which the pattern of the reticle 20 is projected (transferred). However, the wafer 40 can be substituted by a glass plate or another substrate. The wafer 40 is coated with a photoresist.

The wafer stage 45 supports the wafer 40 and a sensor unit 700 and drives them using, for example, a linear motor. The wafer stage 45 exchangeably inserts the wafer 40 and sensor unit 700 onto the image plane of the projection optical system 30. More specifically, the wafer stage 45 inserts the wafer 40 onto the image plane of the projection optical system 30 in transferring the pattern of the reticle 20 by exposure, while it inserts the sensor unit 700 onto the image plane of the projection optical system 30 in measuring the wavefront aberration of the projection optical system 30.

The adjusting unit 50 adjusts at least one of the illumination optical system 14 and the projection optical system 30 under the control of the control unit 60. The adjusting unit 50 has at least a function of adjusting (correcting) an effective light source distribution formed by the illumination optical system 14, and a function of adjusting (correcting) the wavefront aberration of the projection optical system 30. For example, the adjusting unit 50 adjusts spherical aberration of the projection optical system 30 by driving an optical element of the projection optical system 30 in a direction parallel to the optical axis. The adjusting unit 50 also adjusts coma aberration of the projection optical system 30 by driving an optical element of the projection optical system 30 in a direction perpendicular to the optical axis or tilting it with respect to the optical axis. The adjusting unit 50 also adjusts (corrects) the effective light source distribution by driving an optical element of the illumination optical system 14 or changing a stop or diffractive optical element.

The control unit 60 includes a CPU and memory (not shown) and controls the operation of the exposure apparatus 1. In this embodiment, the control unit 60 controls the adjusting unit 50 based on the measurement result obtained by the measurement unit 70 (to be described later). For example, using the wavefront aberration measurement result obtained by the measurement unit 70, the control unit 60 controls the adjusting unit 50 to optimize the wavefront aberration of the projection optical system 30. Using the diffracted light distribution measurement result obtained by the measurement unit 70, the control unit 60 can also control the adjusting unit 50 to predict a change in the aberration of the projection optical system 30 due to exposure, and to correct the change in aberration during the exposure. Even when the aberration of the projection optical system 30 changes due to exposure, it is possible to continue the exposure in an optimum state while always correcting the aberration. Using the effective light source distribution measurement result obtained by the measurement unit 70, the control unit 60 also controls the adjusting unit 50 to optimize an effective light source distribution formed by the illumination optical system 14. For example, if the effective light source distribution has a dipole shape, the depth of focus and the like in exposure can be optimized by correcting an offset between the two poles. The control unit 60 also controls operations associated with the measurement of optical performances (e.g., the wavefront aberration, effective light source distribution, diffracted light distribution, and pupil transmittance distribution) by the measurement unit 70. For example, the control unit 60 performs calculation processing (calculation processing based on the output from a photoelectric conversion device 740) for measuring the optical performances such as the wavefront aberration of the projection optical system 30, and control (e.g., output switching) of the photoelectric conversion device 740.

The measurement unit 70 has a function of measuring at least one of the wavefront aberration of the projection optical system 30, an effective light source distribution formed by the illumination optical system 14, a diffracted light distribution generated by the pattern of the reticle 20, and the pupil transmittance distribution of the projection optical system 30. In this embodiment, the measurement unit 70 includes the reticle-side measurement substrate 71 and sensor unit 700.

The reticle-side measurement substrate 71 is arranged on the reticle stage 25, and has, for example, an aperture pattern used in measuring the wavefront aberration of the projection optical system 30. The aperture pattern of the reticle-side measurement substrate 71 will be described in detail later together with a method of measuring the wavefront aberration of the projection optical system 30.

The sensor unit 700 is arranged on the wafer stage 45, and includes a wafer-side measurement substrate 720, the photoelectric conversion device 740, and a shield plate 760. As will be described later, the wafer-side measurement substrate 720 has a plurality of aperture patterns with different shapes and areas, such as a rectangular aperture pattern and circular aperture pattern. These aperture patterns are used in measuring, for example, the wavefront aberration of the projection optical system 30, an effective light source distribution formed by the illumination optical system 14, a diffracted light distribution generated by the pattern of the reticle 20, and the pupil transmittance distribution of the projection optical system 30. The wavefront aberration, effective light source distribution, diffracted light distribution, pupil transmittance distribution, and the like can be measured by receiving light beams, which have passed through the aperture patterns, by the photoelectric conversion device 740. The shield plate 760 is inserted between the projection optical system 30 and the wafer-side measurement substrate 720, and can be driven in a direction perpendicular to the optical axis. When one of the wavefront aberration, effective light source distribution, diffracted light distribution, pupil transmittance distribution, and the like is measured, the shield plate 760 prevents a light beam having passed through the projection optical system 30 from entering any aperture patterns which are not used in the measurement.

Figure 2:
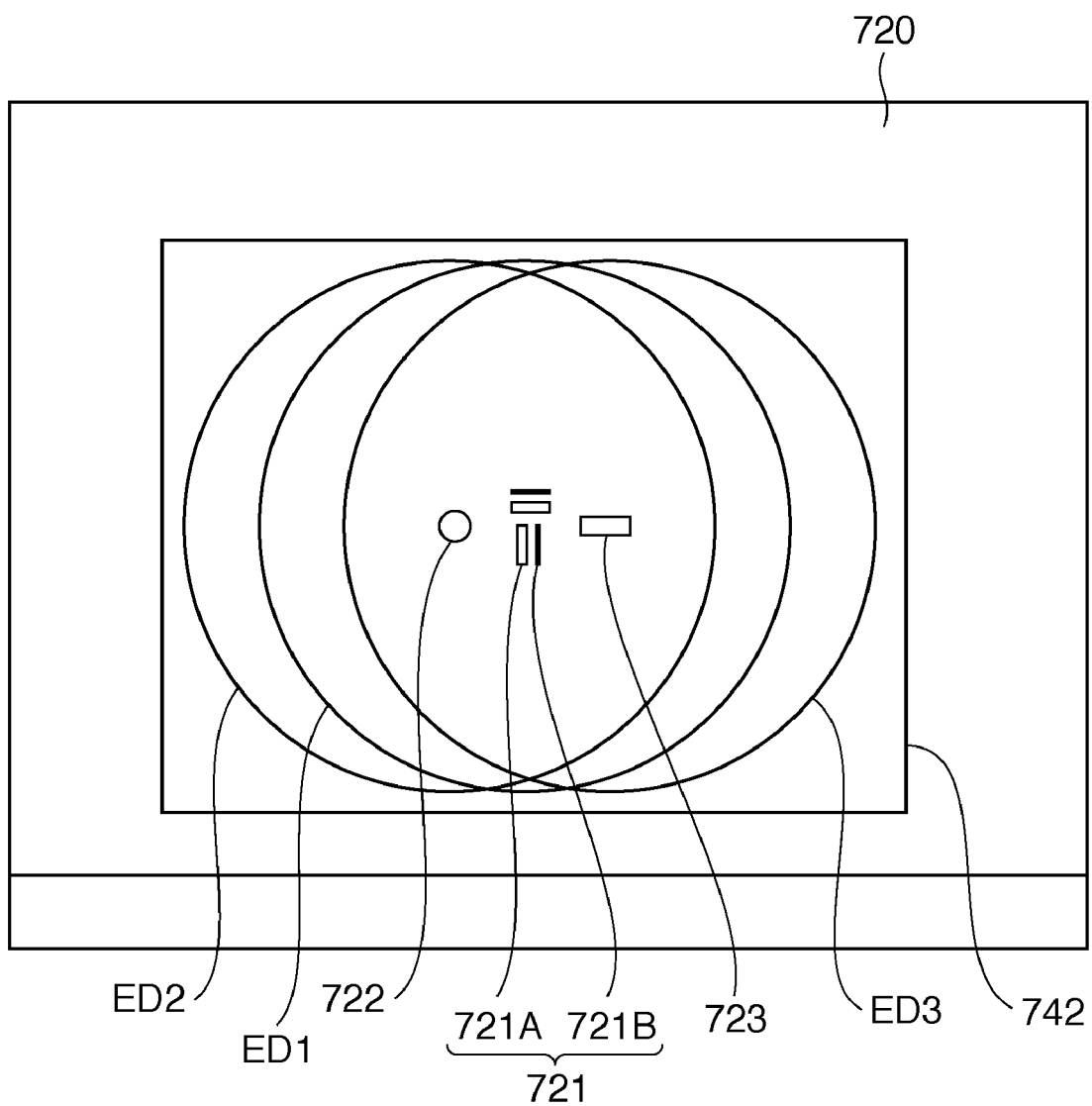
FIG. 2 is a view showing the arrangement of a wafer-side measurement substrate and photoelectric conversion device of a sensor unit in the exposure apparatus shown in FIG. 1.

The wafer-side measurement substrate 720 and photoelectric conversion device 740 will be explained in detail herein. FIG. 2 is a view showing the arrangement of the wafer-side measurement substrate 720 and photoelectric conversion device 740. The wafer-side measurement substrate 720 has a pair of slits 721 (slits 721A and 721B) with different widths as aperture patterns used in measuring the wavefront aberration. The wafer-side measurement substrate 720 also has a pinhole 722 with a diameter of about 10 µm to 90 µm as an aperture pattern used in measuring the effective light source distribution. The wafer-side measurement substrate 720 also has a slit 723 with a length of about 10 µm to 90 µm as an aperture pattern used in measuring the diffracted light distribution. The pair of slits 721, pinhole 722, and slit 723 are formed adjacent to each other at a distance of about 10 µm to 900 µm. With this arrangement, only one photoelectric conversion device 740 can receive light beams which emerge from the pair of slits 721, pinhole 722, and slit 723.

Assuming that the thickness of the wafer-side measurement substrate 720 is 1 mm, the refractive index of the wafer-side measurement substrate 720 is 1.56, and the distance from the aperture pattern surface of the wafer-side measurement substrate 720 to the photoelectric conversion device 740 is 2.5 mm, a light beam with an NA of 0.9 has a diameter φ of 7.6 mm on the photoelectric conversion device 740. Assume also that the slits 721, pinhole 722, and slit 723 align themselves in a line, and the interval between these adjacent aperture patterns is 0.5 mm. In this case, a light beam which enters the photoelectric conversion device 740 falls within the range of an ellipse which has a major axis of 8.6 mm and a minor axis of 7.6 mm and in which effective diameters ED1, ED2, and ED3, on the photoelectric conversion device 740, of light beams which emerge from the slits 721, pinhole 722, and slit 723 overlap each other. For this reason, when the photoelectric conversion device 740 has a light-receiving surface 742 with an area large enough to circumscribe the ellipse, it can receive all-NA light beams which emerge from the pair of slits 721, pinhole 722, and slit 723. More specifically, the photoelectric conversion device 740 includes a CCD having a light-receiving surface 742 with a size of 8.6 mm×7.6 mm or more. Consequently, a plurality of optical performances such as the wavefront aberration, effective light source distribution, and diffracted light distribution can be measured using only one wafer-side measurement substrate 720 and one photoelectric conversion device 740. Also, the pupil transmittance distribution of the projection optical system 30 can be measured using a σ1 illumination mode in which the effective light source distribution is known, and the pinhole 722 used in measuring the effective light source distribution.

Methods of measuring the wavefront aberration of the projection optical system 30, an effective light source distribution formed by the illumination optical system 14, a diffracted light distribution generated by the pattern of the reticle 20, and the pupil transmittance distribution of the projection optical system 30 will be explained below.

Figure 3:
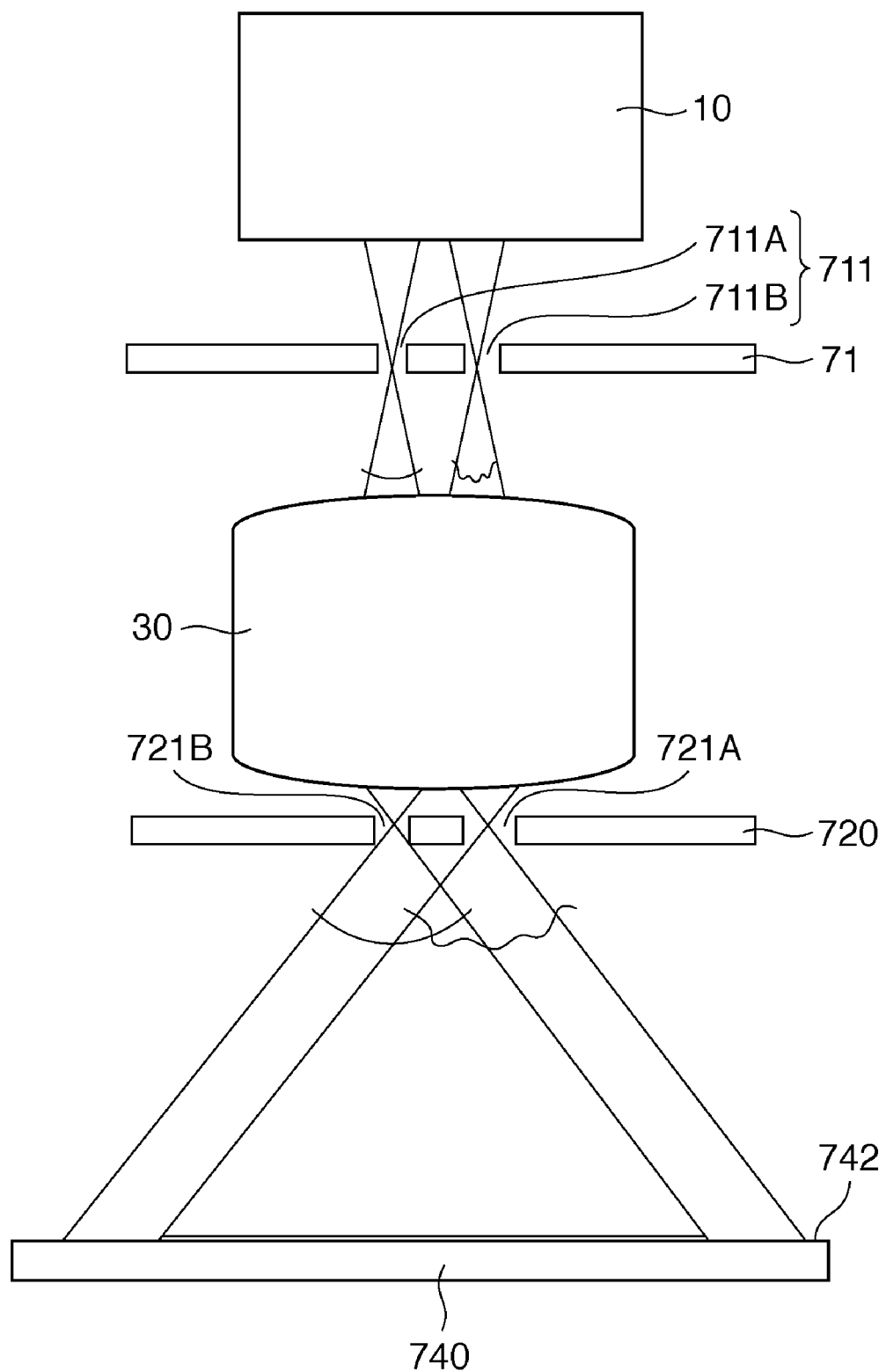
FIG. 3 is a view for explaining a method of measuring the wavefront aberration using a measurement unit of the exposure apparatus shown in FIG. 1.

A method of measuring the wavefront aberration of the projection optical system 30 will be explained first. FIG. 3 is a view for explaining a method of measuring the wavefront aberration using the measurement unit 70. Members and constituent elements which are not involved in the wavefront aberration measurement are not illustrated in FIG. 3.

In measuring the wavefront aberration of the projection optical system 30, the reticle-side measurement substrate 71 and, more specifically, a pair of slits 711 (slits 711A and 711B) of the reticle-side measurement substrate 71 are inserted onto the object plane of the projection optical system 30. The slit 711A has a width (slit width) equal to or smaller than the resolution limit (i.e., equal to or smaller than the diffraction limit) of the projection optical system 30 on the object plane side. Letting na be the numerical aperture of the projection optical system 30 on the object plane side, and λ be the wavelength, a width d of the slit 711A preferably satisfies d≦0.61×λ/na. The slit 711B can have the same width as that of the slit 711A or can have a width wider than that of the slit 711A. The slits 711A and 711B are formed adjacent to each other such that they fall within the so-called isoplanatic region in which the projection optical system 30 has the same aberration between them.

When the slits 711A and 711B are illuminated with light from the illumination apparatus 10, a light component having a wavefront with no aberration in the widthwise direction of the slit 711A emerges from the slit 711A. If the slit 711B has a width wider than that of the slit 711A, a light component having a wavefront influenced by the aberration of the illumination apparatus 10 (illumination optical system 14) emerges from the slit 711B.

The light components which emerge from the slits 711A and 711B come under the influence, on their wavefronts, of the aberration of the projection optical system 30 upon passing through the projection optical system 30, and form images of the slits 711A and 711B on the image plane of the projection optical system 30.

The pair of slits 721 of the wafer-side measurement substrate 720 are inserted onto the image plane of the projection optical system 30. At this time, the shield plate 760 shields the pinhole 722 and slit 723 which are not used in measuring the wavefront aberration of the projection optical system 30. The pair of slits 721 are formed in (arranged on) the wafer-side measurement substrate 720 such that the slit 721A is set at the image position of the slit 711A, and the slit 721B is set at the image position of the slit 711B. The slit 721B has a width (slit width) equal to or smaller than the resolution limit (i.e., equal to or smaller than the diffraction limit) of the projection optical system 30 on the image plane side. Letting NA be the numerical aperture of the projection optical system 30 on the image plane side, and $\lambda$ be the wavelength, a width D of the slit 721B preferably satisfies $D \leq 0.61 \times \lambda/NA$. The slit 721A has a width sufficiently larger than the resolution limit of the projection optical system 30. The width of the slit 721A is preferably about 10 times to 100 times that of the slit 721B.

The light component which has formed an image on the slit 721B has a wavefront influenced by the aberration of the projection optical system 30 (and influenced by the aberration of the illumination apparatus 10 depending on the width of the slit 711B). However, a wavefront with no aberration in the widthwise direction of the slit 721B emerges from the slit 721B as the light component passes through the slit 721B. On the other hand, the light component which has formed an image on the slit 721A has a wavefront influenced by only the aberration of the projection optical system 30 in the widthwise direction of the slit 721A. The width of the slit 721A is large enough to allow the wavefront influenced by only the aberration of the projection optical system 30 to emerge intact.

The light components from the slits 721A and 721B interfere with each other to form an interference pattern (interference fringes). When the light-receiving surface 742 of the photoelectric conversion device 740 detects this interference pattern, the wavefront aberration of the projection optical system 30 in the widthwise direction of the slits can be measured. The wavefront aberration of the projection optical system 30 in a direction perpendicular to the widthwise direction of the slits can be measured using a pair of slits extending in a direction perpendicular to the direction in which the slits 711A and 711B extend, and a pair of slits extending in a direction perpendicular to the direction in which the slits 721A and 721B extend.

It is also possible to measure the wavefront aberrations of the projection optical system 30 in all directions by forming a pair of pinholes with different areas on each of the object and image planes of the projection optical system 30 instead of forming a pair of slits on each of these planes, and setting the diameters of the pair of pinholes equal to the above-described slit widths. In this case, each of the reticle-side measurement substrate 71 and wafer-side measurement substrate 720 has a pair of pinholes. The use of a pair of slits or pinholes of each of the reticle-side measurement substrate 71 and wafer-side measurement substrate 720 allows measuring the wavefront aberration of the projection optical system 30.

Figure 4:
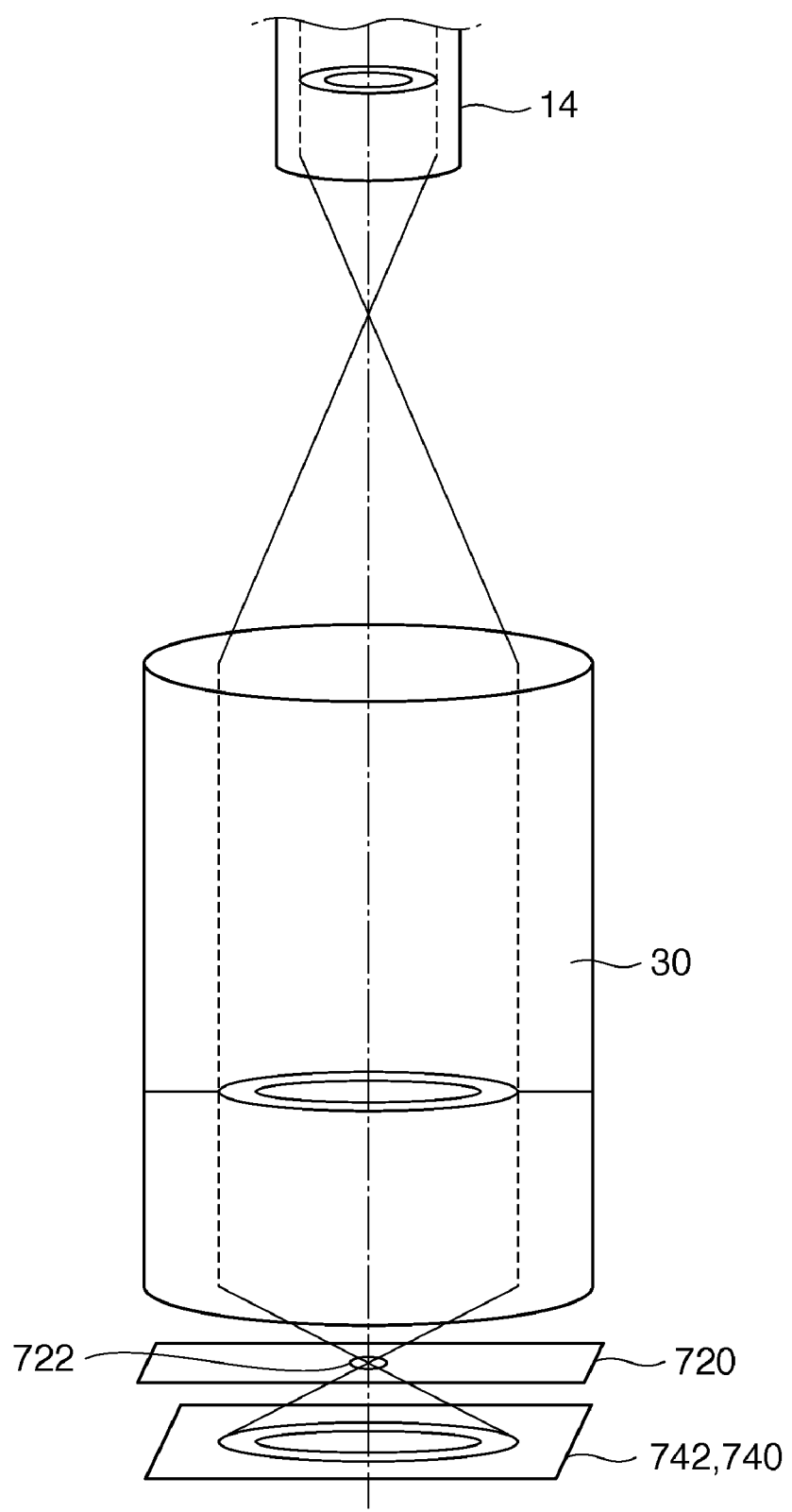
FIG. 4 is a view for explaining a method of measuring the effective light source distribution using the measurement unit of the exposure apparatus shown in FIG. 1.

A method of measuring an effective light source distribution formed by the illumination optical system 14 will be explained next. FIG. 4 is a view for explaining a method of measuring the effective light source distribution using the measurement unit 70. Members and constituent elements which are not involved in the effective light source distribution measurement are not illustrated in FIG. 4.

In measuring the effective light source distribution, the pinhole 722 of the wafer-side measurement substrate 720 is inserted on the image plane of the projection optical system 30. At this time, the shield plate 760 shields the pair of slits 721 and slit 723 which are not used in measuring the effective light source distribution.

When the pinhole 722 of the wafer-side measurement substrate 720 is illuminated with light having a diameter larger than that of the pinhole 722 via the illumination optical system 14 and projection optical system 30, the light having passed through the pinhole 722 enters the light-receiving surface 742 of the photoelectric conversion device 740.

As described above, the pinhole 722 of the wafer-side measurement substrate 720 is spaced apart from the light-receiving surface 742 of the photoelectric conversion device 740 by a distance of about 2.5 mm. An intensity distribution reflecting (the shape of) an effective light source distribution formed by the illumination optical system 14 is projected onto the light-receiving surface 742 in accordance with the principle of a pinhole camera. Note that the light-receiving surface 742 of the photoelectric conversion device 740 is not conjugate to the pupil plane of the projection optical system 30 because the light-receiving surface 742 is defocused from the image plane of the projection optical system 30. The following calculation processing is therefore necessary to calculate the effective light source distribution (the intensity distribution on the pupil plane) of the illumination optical system 14 from the intensity distribution projected onto the light-receiving surface 742 of the photoelectric conversion device 740.

Assume that the position where the central ray of a light beam which emerges from the pinhole 722 enters the light-receiving surface 742 of the photoelectric conversion device 740 is zero, and let L be the distance from the pinhole 722 to the light-receiving surface 742 of the photoelectric conversion device 740. Then, light which emerges from the pinhole 722 with an angle $\theta$ reaches a position of $L \times \tan \theta$ on the light-receiving surface 742 of the photoelectric conversion device 740.

The coordinate position on the pupil plane of the optical system can be defined by $\sin \theta$. In other words, the intensity distribution data on the pupil plane can be calculated by transforming the intensity distribution data on the light-receiving surface 742 of the photoelectric conversion device 740, which is obtained according to the $\tan \theta$ coordinate system, into that according to the $\sin \theta$ coordinate system. The transformed intensity distribution data represents the effective light source distribution of the illumination optical system 14.

Figure 5:
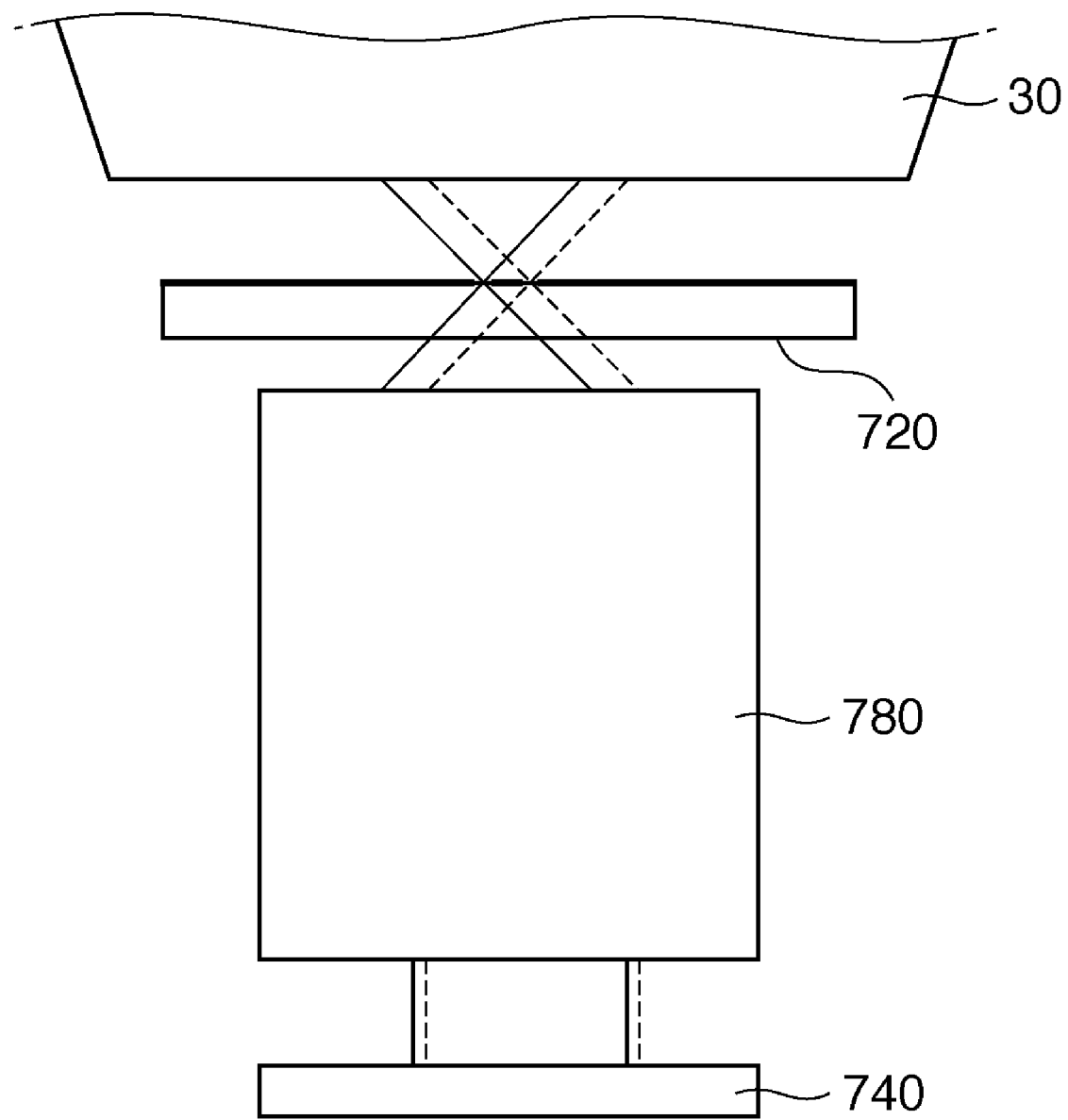
FIG. 5 is a view showing an optical system inserted between the wafer-side measurement substrate and the photoelectric conversion device in the measurement unit of the exposure apparatus shown in FIG. 1.

In this manner, the use of the pinhole 722 of the wafer-side measurement substrate 720 allows measuring an effective light source distribution formed by the illumination optical system 14. As shown in FIG. 5, the light-receiving surface 742 of the photoelectric conversion device 740 can be set conjugate to the pupil plane of the projection optical system 30 by inserting an optical system (pupil imaging optical system) 780 having a positive power between the wafer-side measurement substrate 720 and the photoelectric conversion device 740. This obviates the need for calculation to transform the intensity distribution according to the $\tan \theta$ coordinate system into that according to the sin θ coordinate system. Also, since the measurement time shortens and calculation errors are suppressed from being generated, the measurement accuracy improves. When at least one convex lens is included in the optical system 780, it is also possible to decrease the angle of divergence of a light beam which emerges from the wafer-side measurement substrate 720, and the effective diameter of the light beam on the light-receiving surface 742 of the photoelectric conversion device 740. This makes it possible to reduce the light-receiving surface 742 of the photoelectric conversion device 740 (i.e., attain the downsizing of the photoelectric conversion device 740), thus narrowing a region, on the wafer stage 45, to arrange the photoelectric conversion device 740 (sensor unit 700). Note that FIG. 5 is a view showing the optical system 780 inserted between the wafer-side measurement substrate 720 and the photoelectric conversion device 740.

Figure 6:
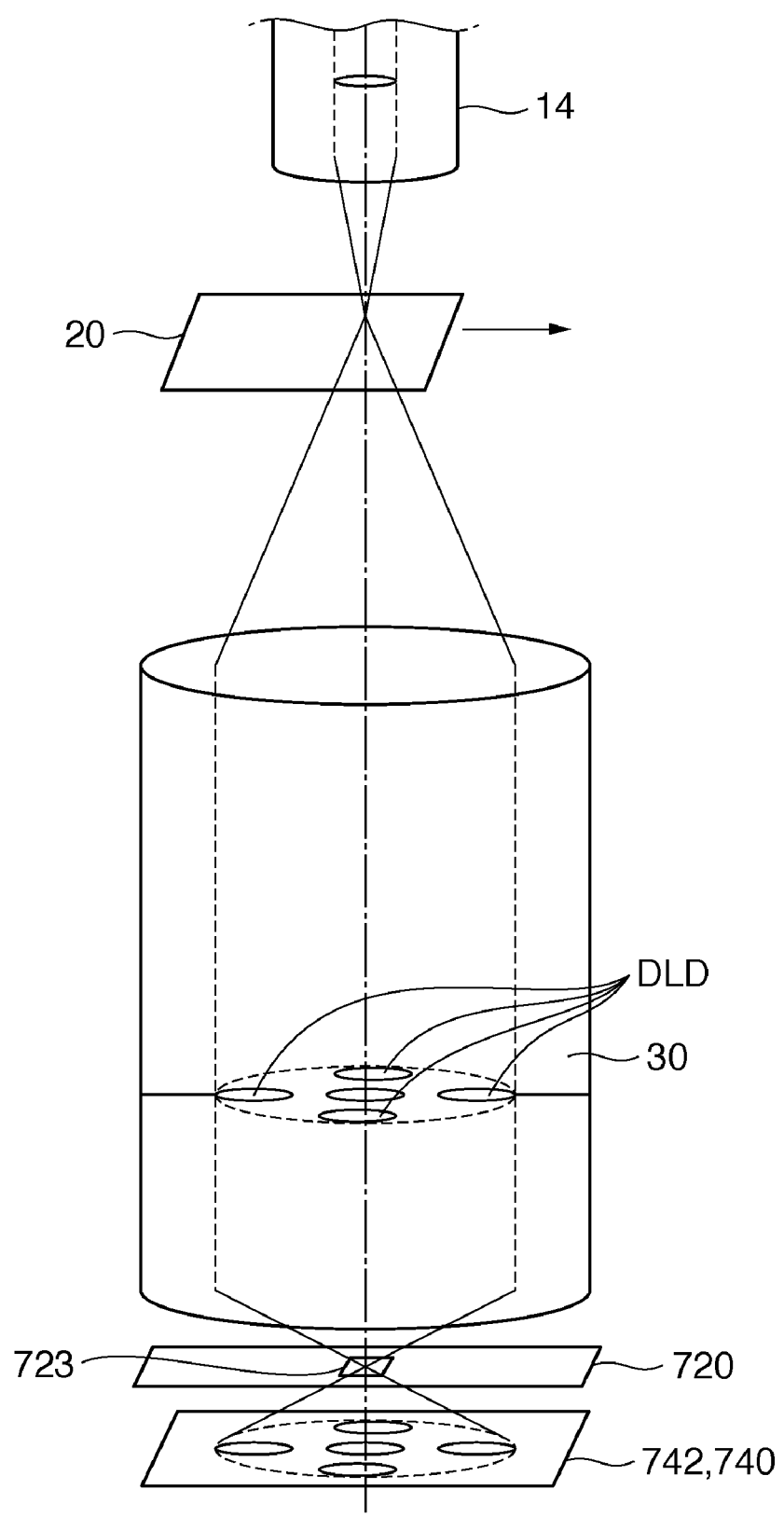
FIG. 6 is a view for explaining a method of measuring the diffracted light distribution using the measurement unit of the exposure apparatus shown in FIG. 1.

A method of measuring a diffracted light distribution generated by the pattern of the reticle 20 will be explained next. FIG. 6 is a view for explaining a method of measuring the diffracted light distribution using the measurement unit 70. Members and constituent elements which are not involved in the diffracted light distribution measurement are not illustrated in FIG. 6.

As the reticle 20 for use in actual exposure is inserted onto the object plane of the projection optical system 30 and illuminated under an illumination condition under which it is actually exposed, diffracted light is generated in accordance with the pattern of the reticle 20 and enters the projection optical system 30. When this occurs, an intensity distribution according to the illumination condition (effective light source distribution) and the diffracted light from the reticle 20, that is, a diffracted light distribution DLD is generated on the pupil plane of the projection optical system 30. In view of this, the intensity distribution on the pupil plane of the projection optical system 30 in actual exposure is not uniform but takes various forms in accordance with the illumination condition and the pattern of the reticle 20.

Although the aberration of the projection optical system 30 is known to change due to, for example, the generation of exposure heat, there exist a portion which comes under a locally strong influence of the exposure heat and that which comes under little influence of the exposure heat, depending on the diffracted light distribution DLD. Consequently, a change in the aberration of the projection optical system 30 due to the exposure heat changes depending on the diffracted light distribution DLD. Measuring the diffracted light distribution DLD makes it possible to accurately (precisely) predict a change in the aberration of the projection optical system 30 during actual exposure.

Because the pattern of the reticle 20 has regions with different optical properties, precise measurement of the diffracted light distribution DLD requires its measurement over the entire exposure surface (the entire surface of the reticle 20). In general, the maximum area that an exposure apparatus of the step & scan scheme exposes at once is as very large as 26 mm×33 mm on the wafer 40. If the photoelectric conversion device 740 arranged on the wafer stage 45 can receive at once all light beams which emerge from a region with such a large area, it is possible to measure the diffracted light distribution DLD on the entire exposure surface. However, this approach is impractical because the photoelectric conversion device 740 needs to have a square light-receiving surface 742 with a side of about 50 mm.

To overcome this situation, this embodiment inserts the slit 723 of the wafer-side measurement substrate 720 onto the image plane of the projection optical system 30, and receives a light beam having passed through the slit 723 by the photoelectric conversion device 740. At this time, the shield plate 760 shields the pair of slits 721 and pinhole 722 which are not used in measuring the diffracted light distribution DLD. Note that the slit 723 has a dimension of about 0.5 mm to 1 mm in a direction perpendicular to the scanning direction, and a dimension of about 10 μm to 90 μm in a direction parallel to the scanning direction.

More specifically, the wafer stage 45 is driven so that the slit 723 is positioned at the left end of the stationary exposure area of the exposure apparatus 1. The reticle stage 25 which mounts the reticle 20 is then driven so that the reticle 20 is scanned while being illuminated under a desired illumination condition. During the scanning of the reticle 20, the light-receiving surface 742 of the photoelectric conversion device 740 receives a light beam which emerges from the slit 723 without driving the slit 723. For example, assume that the dimension of the slit 723 in a direction perpendicular to the scanning direction is 1 mm, and the dimension of the exposure region of the reticle 20 in the scanning direction is 33 mm (when the dimension of this exposure region on the reticle 20 is converted into that on the wafer 40). In this case, the photoelectric conversion device 740 obtains an intensity distribution according to the diffracted light distribution DLD in a region of 1 mm×33 mm by scanning the reticle 20 once. The slit 723 is moved to the right by 1 mm, and the light-receiving surface 742 of the photoelectric conversion device 740 receives a light beam which emerges from the slit 723 while the reticle 20 is scanned. It is possible to obtain an intensity distribution according to the diffracted light distribution DLD in a region of 2 mm×33 mm by adding the intensity distribution obtained before the slit 723 is moved to that obtained after the slit 723 is moved. It is therefore possible to obtain an intensity distribution according to the diffracted light distribution DLD on the entire surface of the exposure region (reticle 20) by repeating the movement of the slit 723 in a direction perpendicular to the scanning direction and the reception of a light beam from the slit 723. Note that the light-receiving surface 742 of the photoelectric conversion device 740 is not conjugate to the pupil plane of the projection optical system 30 in the diffracted light distribution measurement either. To transform the intensity distribution measured by the photoelectric conversion device 740 into the diffracted light distribution on the pupil plane of the projection optical system 30, a transformation from the tan θ coordinate system to the sin θ coordinate system is necessary as in the effective light source distribution measurement.

In this manner, the use of the slit 723 of the wafer-side measurement substrate 720 allows to measure a diffracted light distribution generated by the pattern of the reticle 20.

The measurement unit 70 can also measure the pupil transmittance distribution of the projection optical system 30. More specifically, the pinhole 722 of the wafer-side measurement substrate 720 is inserted onto the image plane of the projection optical system 30, and the pinhole 722 is illuminated with a σ1 illumination mode in which the pupil intensity distribution is known. The coordinate system of an intensity distribution obtained by receiving a light beam from the pinhole 722 by the photoelectric conversion device 740 is transformed from the tan θ coordinate system into the sin θ coordinate system. The transformed intensity distribution is divided by the intensity distribution on the pupil plane of the illumination optical system 14. This makes it possible to measure the pupil transmittance distribution of the projection optical system 30.

In this embodiment, aperture patterns for respectively measuring the wavefront aberration, effective light source distribution, and diffracted light distribution are formed on the wafer-side measurement substrate 720 to be adjacent to each other. This makes it possible to measure a plurality of optical performances such as the wavefront aberration, effective light source distribution, diffracted light distribution, and pupil transmittance distribution using only one wafer-side measurement substrate 720 and one photoelectric conversion device 740.

Figure 7:
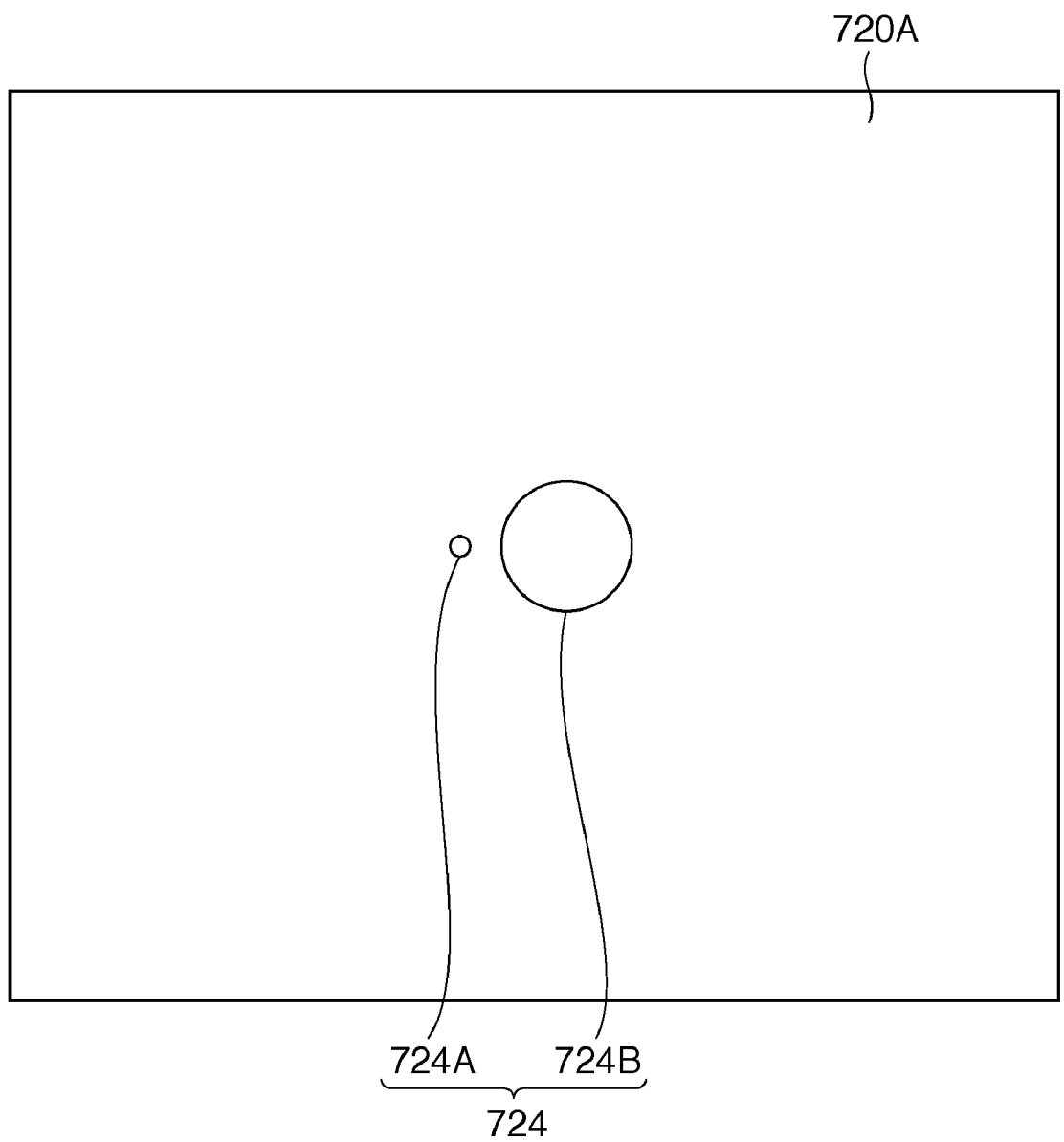
FIG. 7 is a view showing the arrangement of a wafer-side measurement substrate of the sensor unit in the exposure apparatus shown in FIG. 1.

Although the wafer-side measurement substrate 720 has aperture patterns dedicated to respectively measuring the wavefront aberration, effective light source distribution, and diffracted light distribution, it may have a common aperture pattern for measuring the wavefront aberration, effective light source distribution, and diffracted light distribution as shown in FIG. 7. FIG. 7 is a view showing the arrangement of a wafer-side measurement substrate 720A having a pair of pinholes 724 (pinholes 724A and 724B) as a common aperture pattern for measuring the wavefront aberration, effective light source distribution, and diffracted light distribution.

In measuring the wavefront aberration of the projection optical system 30, the wafer-side measurement substrate 720A and, more specifically, the pair of pinholes 724 (pinholes 724A and 724B) of the wafer-side measurement substrate 720A are inserted onto the image plane of the projection optical system 30. The pinhole (first pinhole) 724A has a diameter equal to or smaller than the resolution limit of the projection optical system 30 on the object plane side and, preferably, has a diameter equal to or smaller than $0.61 \times \lambda/NA$ where NA is the numerical aperture of the projection optical system 30 on the image plane side, and $\lambda$ is the wavelength. The pinhole (second pinhole) 724B has a diameter of about 10 µm to 90 µm.

A pair of pinholes of the reticle-side measurement substrate 71 are inserted on the object plane side of the projection optical system 30. At least one pinhole of the pair of pinholes has a diameter equal to or smaller than the resolution limit of the projection optical system 30 on the object plane side and, preferably, has a diameter equal to or smaller than $0.61 \times \lambda/na$ where na is the numerical aperture of the projection optical system 30 on the object plane side, and $\lambda$ is the wavelength. The other pinhole can have a diameter equal to or smaller than the resolution limit of the projection optical system 30 on the object plane side or can have a diameter larger than the resolution limit of the projection optical system 30 on the object plane side.

In this manner, the use of the pair of pinholes of the reticle-side measurement substrate 71 and the pair of pinholes 724 (pinholes 724A and 724B) of the wafer-side measurement substrate 720A allows measuring the wavefront aberration of the projection optical system 30.

In measuring the effective light source distribution, the pinhole 724B is illuminated via the illumination optical system 14 and projection optical system 30 while the shield plate 760 shields the pinhole 724A of the wafer-side measurement substrate 720A. With this operation, the effective light source distribution can be measured by the same mechanism as described above.

The diffracted light distribution can be measured using the pinhole 724B of the wafer-side measurement substrate 720A by the same mechanism as described above. The diameter of the pinhole 724A of the wafer-side measurement substrate 720A is smaller than the length of the slit 723 of the wafer-side measurement substrate 720. For this reason, the measurement of the diffracted light distribution on the entire surface of the reticle 20 requires a relatively large number of times of movement of the pinhole 724A in a direction perpendicular to the scanning direction, which may result in a long measurement time. However, the diffracted light distribution can be measured without changing the number of times of movement of the pinhole 724A from a normal one, although a strict diffracted light distribution on the entire surface of the reticle 20 is not measured.

The pupil transmittance distribution can be measured using the pinhole 724B of the wafer-side measurement substrate 720A by the same mechanism as described above.

In this manner, by forming two circular aperture patterns with different diameters (sizes) on the wafer-side measurement substrate 720A, the wavefront aberration, effective light source distribution, diffracted light distribution, and pupil transmittance distribution can be measured without using their dedicated aperture patterns.

Figure 8:
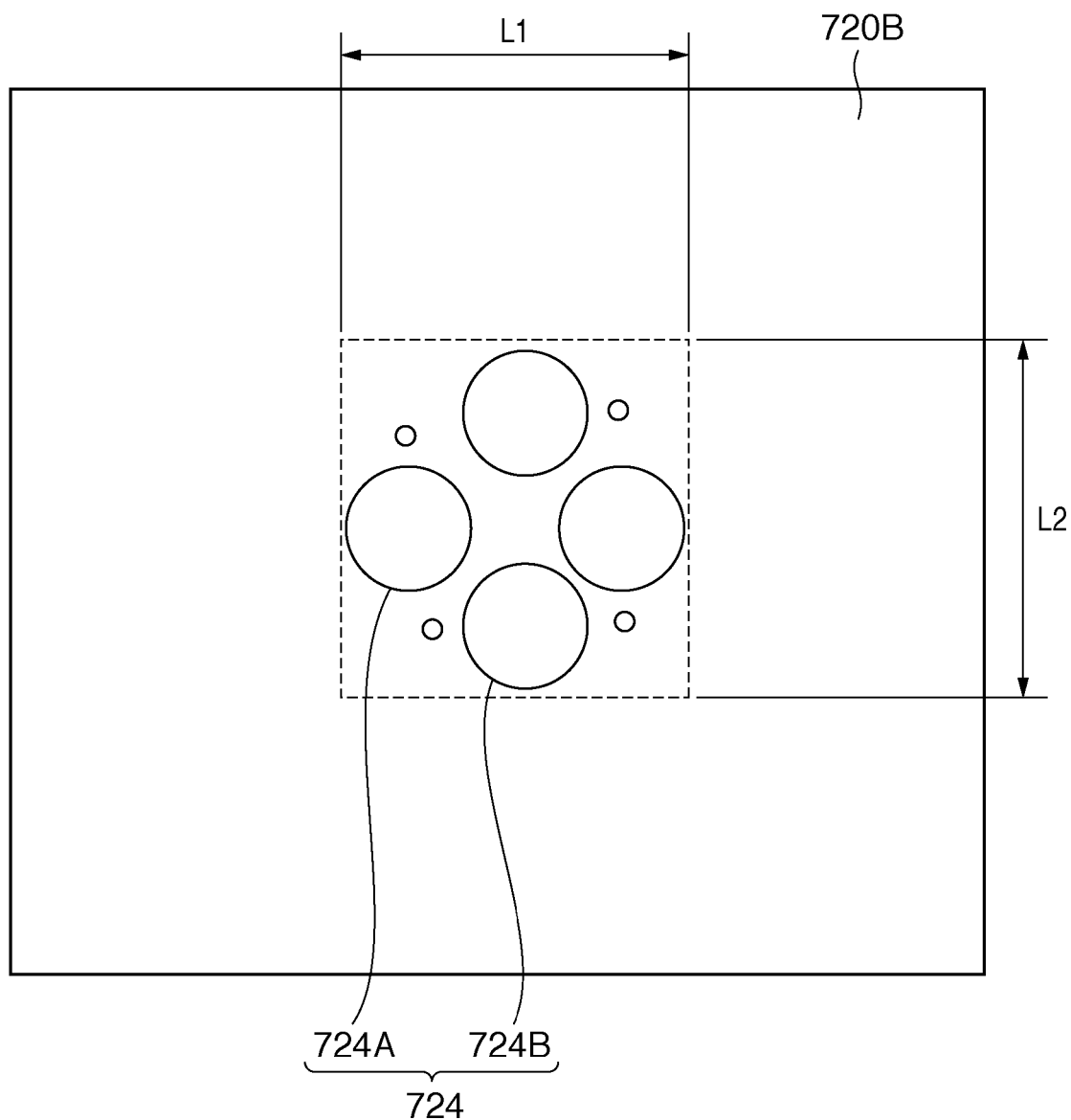
FIG. 8 is a view showing the arrangement of a wafer-side measurement substrate of the sensor unit in the exposure apparatus shown in FIG. 1.

Preliminary aperture patterns are often formed on the wafer-side measurement substrate 720 by taking account of dirt or damage to aperture patterns for measuring, for example, the wavefront aberration, effective light source distribution, and diffracted light distribution. FIG. 8 is a view showing the arrangement of a wafer-side measurement substrate 720B having a plurality of pairs of pinholes 724 (pinholes 724A and 724B) identical to that of the wafer-side measurement substrate 720A shown in FIG. 7.

The wavefront aberration is measured using one of the plurality of pairs of pinholes 724 by the same mechanism as described above. The effective light source distribution is measured using the pinhole 724B of the pinholes 724.

The diffracted light distribution is measured using all the pinholes 724 formed in the wafer-side measurement substrate 720B. For example, consider a case in which four pairs of pinholes 724 are formed in a region of L1×L2, as shown in FIG. 8. If the dimensions L1 and L2 are 0.5 mm, the light-receiving surface 742 of the photoelectric conversion device 740 can receive light beams which emerge from all the pinholes 724B at once. This allows measurement nearly equivalent to that when a 0.5-mm square aperture pattern is used. It is therefore possible to widen a region which can be measured by one scanning and therefore to decrease the number of times of movement of the pinhole 724B as compared with a case in which the wafer-side measurement substrate 720 on which only one slit 723 is formed is used.

Figure 9:
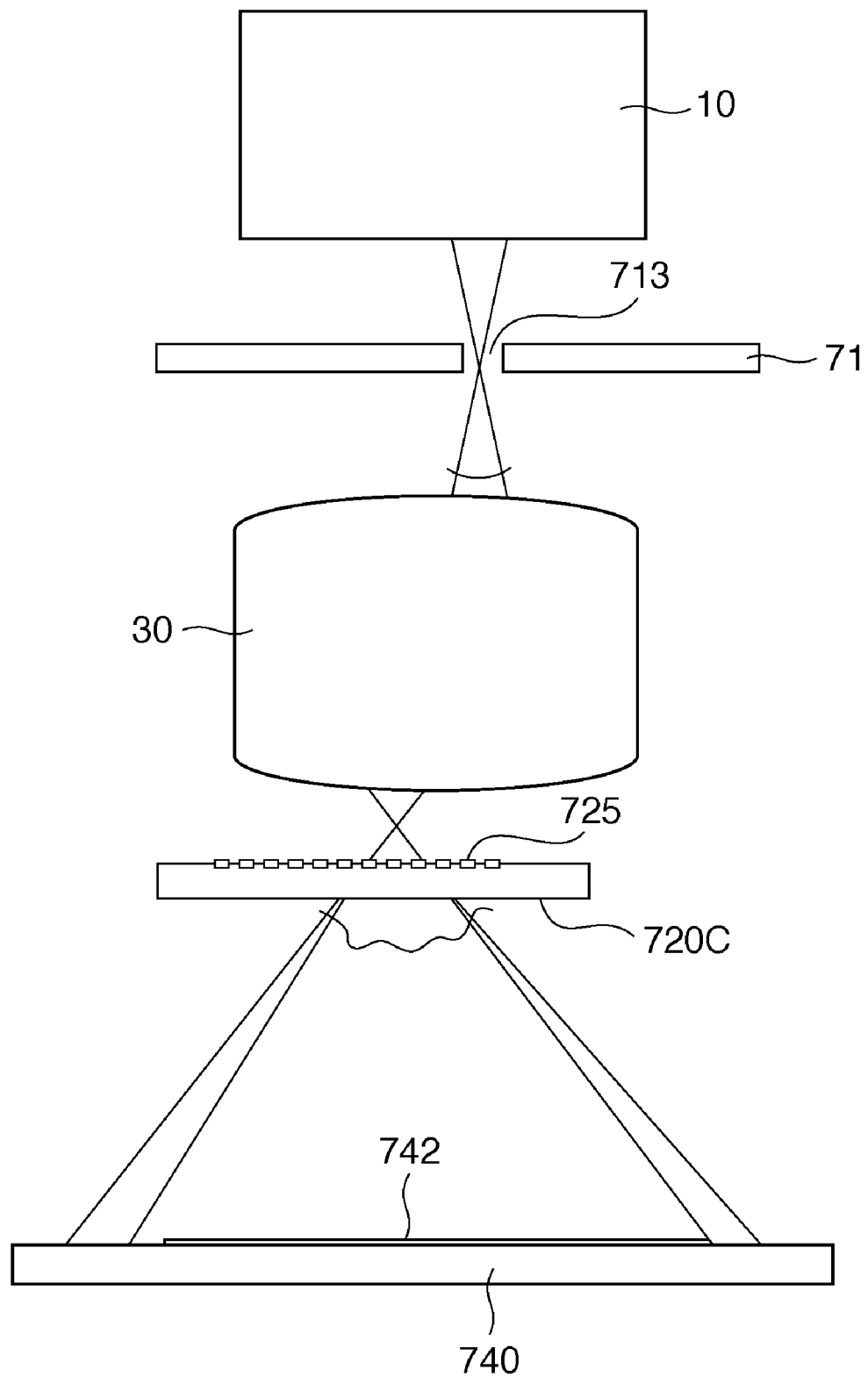
FIG. 9 is a view for explaining a method of measuring the wavefront aberration using the measurement unit of the exposure apparatus shown in FIG. 1.
Figure 10:
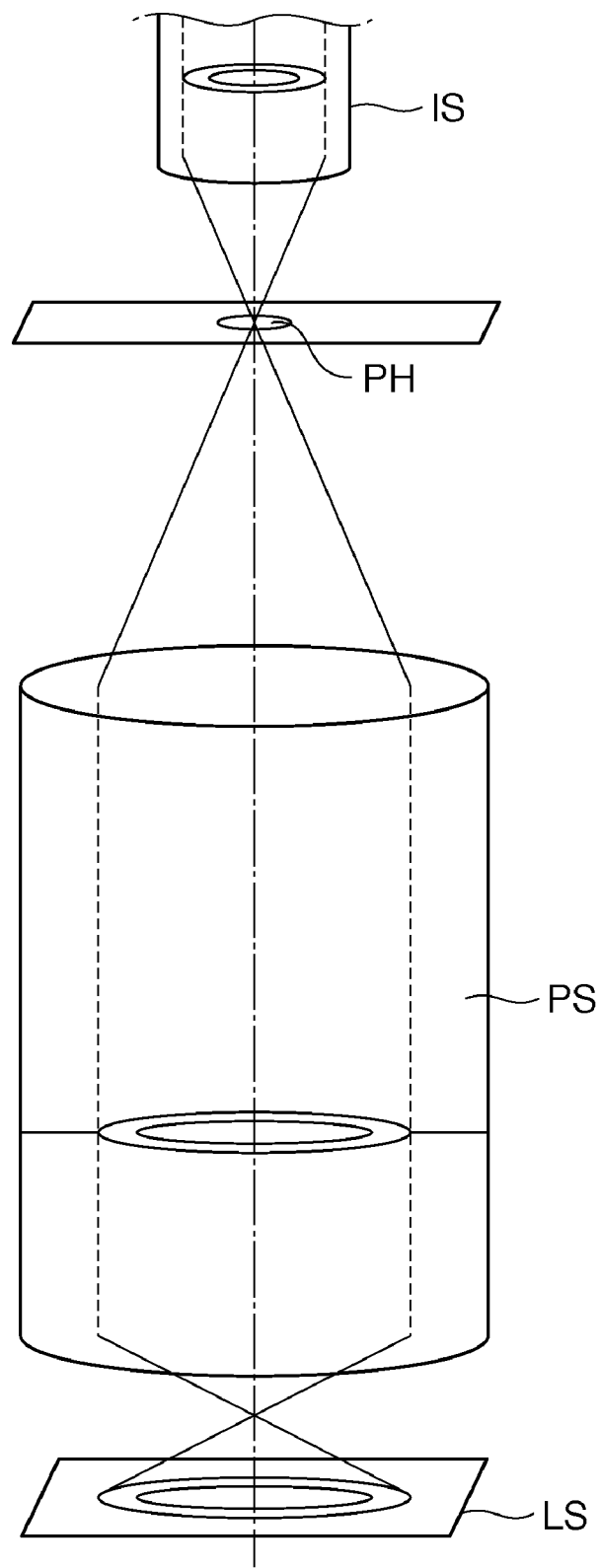
FIG. 10 is a view for explaining the conventional mechanism of effective light source distribution measurement.

It is also possible to form a diffraction grating pattern 725 on the wafer-side measurement substrate 720 as shown in FIG. 9. In this case, the wavefront aberration of the projection optical system 30 is measured using the shearing interference scheme. Note that FIG. 9 is a view for explaining a method of measuring the wavefront aberration using the measurement unit 70.

More specifically, the reticle-side measurement substrate 71 and, more specifically, a pinhole 713 of the reticle-side measurement substrate 71 are inserted onto the object plane of the projection optical system 30. The pinhole 713 has a diameter equal to or smaller than the resolution limit (i.e., equal to or smaller than the diffraction limit) of the projection optical system 30 on the object plane side. A light beam with no aberration emerges from the pinhole 713 and enters the projection optical system 30.

The diffraction grating pattern 725 of the wafer-side measurement substrate 720 is inserted on the image plane side of the projection optical system 30. The shield plate 760 shields the pinhole 722 and slit 723 which are not used in measuring the wavefront aberration of the projection optical system 30. The diffraction grating pattern 725 is set at a position defocused from the image plane of the projection optical system 30. The light beam which emerges from the projection optical system 30 is split into, for example, two or more light beams by the diffraction grating pattern 725, and enters the light-receiving surface 742 of the photoelectric conversion device 740. An interference pattern is thus formed on the light-receiving surface 742 of the photoelectric conversion device 740. This interference pattern is generated by shearing a single wavefront in the lateral direction, and represents the difference between two wavefronts generated by shearing a single wavefront in a certain direction. The wavefront aberration can be calculated by integrating the interference pattern in the direction in which a single wavefront is sheared.

In measuring the effective light source distribution, diffracted light distribution, and pupil transmittance, the pinhole 722 or slit 723 of the wafer-side measurement substrate 720 is inserted onto the image plane of the projection optical system 30, as described above. When the diffraction grating pattern 725 of the wafer-side measurement substrate 720 is inserted onto the image plane of the projection optical system 30 without being defocused, it is also possible to measure the effective light source distribution, diffracted light distribution, and pupil transmittance distribution using the aperture of the diffraction grating pattern 725.

In this embodiment, the measurement specifications of the photoelectric conversion device 740 can be optimized (i.e., the output from the photoelectric conversion device 740 can be switched) in accordance with cases in which the wavefront aberration, effective light source distribution, diffracted light distribution, and pupil transmittance distribution are measured. The measurement specifications of the photoelectric conversion device 740 include, for example, the number of pixels to be used (division number), the accumulation time, the output gain, and the number of tones.

The pupil division number can be changed in accordance with cases in which the wavefront aberration, effective light source distribution, diffracted light distribution, and pupil transmittance distribution are measured. For example, in measuring the wavefront aberration using a photoelectric conversion device 740 having a light-receiving surface 742 of 1000×1000 pixels, the photoelectric conversion device 740 is used as a photoelectric conversion device of 1000×1000 pixels to measure higher-order aberration components.

The effective light source, diffracted light distribution, or the like can often be sufficiently measured by about 200×200 pixels (division number). In this case, the effective light source distribution or diffracted light distribution may be measured by binning (selecting) 5×5 pixels as one pixel from the pixels of the light-receiving surface 742. In other words, a photoelectric conversion device 740 of 1000×1000 pixels is used as a photoelectric conversion device of 200×200 pixels.

When the measurement is performed by binning 5×5 pixels, that is, a total of 25 pixels as one pixel, the amount of light beam received by one binned pixel increases to 25 times that before the binning. If light has the same energy, the photoelectric conversion device 740 can detect weaker light components upon binning. It is also possible to shorten the accumulation time of the photoelectric conversion device 740 by utilizing the fact that the binning increases the amount of light reception per pixel, thus shortening the measurement time. In addition, since the binning decreases the amount of information read out from the photoelectric conversion device 740, the readout time and transfer time can also be shortened. This makes it possible to shorten the measurement time or perform a plurality of number of times of measurement in the same period of time. Binning some of the pixels of the light-receiving surface 742 also makes it possible to suppress heat generation by the photoelectric conversion device 740 so that its adverse influence on the measurement performance of the photoelectric conversion device 740 can be suppressed. In this manner, it is possible to shorten the measurement time and improve the reproducibility in a plurality of number of times of measurement by binning some of the pixels of the light-receiving surface 742 of the photoelectric conversion device 740 in accordance with the measurement target.

The accumulation time will be explained. In an exposure apparatus which uses a KrF excimer laser or ArF excimer laser as a light source, the light source is a pulse emission laser. Changing the accumulation time of the photoelectric conversion device 740 makes it possible to change the number of pulses which enter the photoelectric conversion device 740. A KrF excimer laser and ArF excimer laser each exhibit a light amount variation a little less than about several percent to 10% per pulse. If the number of accumulated pulses is insufficient, the photoelectric conversion device 740 may generate an image with a light amount variation. The allowance of a light amount variation changes in accordance with the measurement target. The accumulation time of the photoelectric conversion device 740 is set in accordance with the measurement target in the following way. That is, the accumulation time of the photoelectric conversion device 740 is set long if a light amount variation is to be suppressed, while it is set short if the measurement target is insensitive to a light amount variation.

The output gain will be explained next. The output gain herein means that an electrical signal from the photoelectric conversion device 740 is electrically amplified. When the output gain is increased (the electrical amplification is increased), noise is also amplified disadvantageously. On the other hand, the output gain advantageously allows measurement even when an electrical signal from the photoelectric conversion device 740 is relatively weak, that is, the amount of light is relatively small. In view of this, the output gain is set small when low-noise measurement is necessary, and it is set large when low-noise measurement is unnecessary. This makes it possible to shorten the accumulation time of the photoelectric conversion device 740, thus shortening the measurement time.

The number of tones will be explained lastly. An optimal number of tones necessary for measurement is determined in accordance with the measurement target. For example, about 512 tones suffice to measure a change in amount of light of about 1% as in the pupil transmittance distribution, while about 4092 tones are necessary to measure a change in amount of light of about 0.1% as in the effective light source distribution. Although the number of tones which satisfies all measurement targets may be set, unnecessary information increases depending on the measurement target, resulting in prolongation of the time taken to transfer an image from photoelectric conversion device 740 or the processing time. For this reason, the number of tones is preferably, optimally changed in accordance with the measurement target.

In this manner, the wavefront aberration, effective light source distribution, diffracted light distribution, and pupil transmittance distribution can be measured always under their optimal measurement conditions by binning pixels to be used in measurement or changing the accumulation time, the gain, and the number of tones in accordance with cases in which these optical performances are measured.

It is possible to measure a plurality of optical performances such as the wavefront aberration, effective light source distribution, diffracted light distribution, and pupil transmittance distribution using only one photoelectric conversion device 740 by forming aperture patterns for respectively measuring the wavefront aberration, effective light source distribution, and diffracted light distribution on the wafer-side measurement substrate 720. The need to form aperture patterns dedicated to respectively measuring the wavefront aberration, effective light source distribution, and diffracted light distribution may be obviated by improving an aperture pattern. Hence, the measurement unit 70 can measure a plurality of optical performances such as the wavefront aberration, effective light source distribution, diffracted light distribution, and pupil transmittance distribution without any decrease in performance and any increase in size of the wafer stage 45.

In exposure, a light beam emitted by the light source 12 illuminates the reticle 20 via the illumination optical system 14. A light component reflecting the pattern of the reticle 20 forms an image on the wafer 40 via the projection optical system 30. The wavefront aberration, effective light source distribution, diffracted light distribution, and the like of the exposure apparatus 1 are optimally adjusted based on the measurement result obtained by the measurement unit 70. Since the wafer stage 45 for driving the wafer 40 maintains an excellent performance, the reticle 20 and wafer 40 can be aligned with high accuracy and the wafer 40 can be driven in scanning exposure with high accuracy. Hence, the exposure apparatus 1 can provide devices (e.g., a semiconductor device, an LCD device, an image sensing device (e.g., a CCD), and a thin-film magnetic head) with high throughput, high quality, and a good economical efficiency. These devices are fabricated by a step of exposing a substrate (e.g., a wafer or glass plate) coated with a resist (photosensitive agent) using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-183645 filed on Jul. 12, 2007, which is hereby incorporated by reference herein its entirety.

What is claimed is:

1. An exposure apparatus comprising:
   a projection optical system configured to project a pattern of a mask onto a substrate;
   an illumination optical system configured to illuminate the mask;
   a stage configured to move the substrate; and
   a sensor unit arranged on the stage and configured to receive light having passed through the projection optical system,
   wherein the sensor unit includes:
   an aperture plate on which a plurality of aperture patterns are formed, and
   a photoelectric conversion device configured to photoelectrically convert light having passed through at least one of the plurality of aperture patterns,
   wherein the plurality of aperture patterns includes:
   a first aperture pattern configured to measure an aberration of the projection optical system;
   a second aperture pattern configured to measure:
      (1) an effective light source distribution, which is formed on the pupil plane of the illumination optical system,
      (2) a diffractive light distribution generated by the pattern of the mask and formed on a pupil plane on the projection optical system,
      (3) a pupil transmittance distribution of the projection optical system, or
      (4) a combination of two of (1), (2), and (3), and
   a third aperture pattern configured to measure (1), (2), (3), or (4),
   wherein the distribution(s) for which the third aperture pattern is configured to measure is/are different than the distribution(s) for which the second aperture pattern is configured to measure, and
   wherein the exposure apparatus further comprises a control unit configured to perform a calculation that calculates either or both of the distributions for which the second aperture pattern and the third aperture pattern are configured to measure, respectively, based on light having passed through the respective aperture pattern(s) that is photoelectrically converted by the photoelectric conversion device.

2. The apparatus according to claim 1, wherein:
   the second aperture pattern is formed by one aperture, and
   the at least one of the effective light source distribution, the diffractive light distribution, or the pupil transmittance distribution is calculated using the light beams photoelectrically converted by the photoelectric conversion device having passed through the one aperture.

3. The apparatus according to claim 2, wherein the at least one of the effective light source distribution, the diffractive light distribution, or the pupil transmittance distribution is calculated using the light having passed through the one aperture pattern that is photoelectrically converted by the photoelectric conversion device and with no interference from other light.

4. The apparatus according to claim 2, wherein:
   the first aperture pattern and the second aperture pattern include a rectangular aperture pattern and a circular aperture pattern,
   the rectangular aperture pattern and the circular aperture pattern are set such that an effective diameter, on the photoelectric conversion device, of the light beam emerging from the rectangular aperture pattern overlaps an effective diameter, on the photoelectric conversion device, of the light beam emerging from the circular aperture pattern, and
   the photoelectric conversion device has an area large enough to circumscribe at least the effective diameter, on the photoelectric conversion device, of the light beam emerging from the rectangular aperture pattern, and the effective diameter, on the photoelectric conversion device, of the light beam emerging from the circular aperture pattern.

5. The apparatus according to claim 2, wherein:
   the photoelectric conversion device includes a plurality of pixels, and
   pixels to be used among the plurality of pixels, an accumulation time of the pixels, an output gain, and the number of tones are changed in accordance with cases in which the aberration of the projection optical system, the effective light source distribution, the diffractive light distribution, and the pupil transmittance distribution of the projection optical system are to be measured.

6. The apparatus according to claim 1, wherein the first aperture pattern includes a pair of slits having different widths and are configured to be used in measuring the aberration of the projection optical system, and the second aperture pattern is a slit configured to be used in measuring the diffracted light distribution.

7. The apparatus according to claim 1, wherein the second aperture pattern is configured to measure both the effective light source distribution and the pupil transmittance distribution.

8. The apparatus according to claim 1, further comprising:
an adjusting unit configured to adjust the projection optical system, the illumination optical system, or both the projection optical system and the illumination optical system; and
a control unit configured to control the adjusting unit based on the calculation.

9. The apparatus according to claim 1, wherein at least one of the effective light source distribution, the diffractive light distribution, or the pupil transmittance distribution is calculated by converting the photoelectrically converted data of light having passed through the second aperture pattern to a sin θ coordinate system.

10. The apparatus according to claim 1, further comprising a light shielding member configured to prevent light from entering at least one of the plurality of aperture patterns during measurement.

11. A device fabrication method comprising steps of:
exposing a substrate using an exposure apparatus; and
performing a development process for the substrate exposed,
wherein the exposure apparatus includes:
a projection optical system configured to project a pattern of a mask onto the substrate;
an illumination optical system configured to illuminate the mask;
a stage configured to move the substrate; and
a sensor unit arranged on the stage and configured to receive light having passed through the projection optical system,
wherein the sensor unit includes:
an aperture plate on which a plurality of aperture patterns are formed, and
a photoelectric conversion device configured to photoelectrically convert light having passed through at least one of the plurality of aperture patterns,
wherein the plurality of aperture patterns includes:
a first aperture pattern configured to measure an aberration of the projection optical system;
a second aperture pattern configured to measure:
(1) an effective light source distribution, which is formed on the pupil plane of the illumination optical system,
(2) a diffractive light distribution generated by the pattern of the mask and formed on a pupil plane on the projection optical system,
(3) a pupil transmittance distribution of the projection optical system, or
(4) a combination of two of (1), (2), and (3), and
a third aperture pattern configured to measure (1), (2), (3), or (4),
wherein the distribution(s) for which the third aperture pattern is configured to measure is/are different than the distribution(s) for which the second aperture pattern is configured to measure, and
wherein the exposure apparatus further comprising a control unit configured to perform a calculation that calculates either or both of the distribution for which the second aperture pattern and the third aperture pattern are configured to measure, respectively, based on light having passed through the respective aperture pattern(s) that is photoelectrically converted by the photoelectric conversion device.

* * * * *